United States Patent [19]

Koga et al.

[11] Patent Number: 4,650,951
[45] Date of Patent: Mar. 17, 1987

[54] METHOD OF WELDING LAMINATES EACH HAVING THE STRUCTURE OF METAL LAYER/THERMALLY SOFTENABLE INSULATING LAYER/METAL LAYER

[75] Inventors: Hitoshi Koga; Takehisa Noborio, both of Iwakuni; Masushi Nishimoto, Yamaguchi, all of Japan

[73] Assignee: Mitsui Petrochemical Industries, Ltd., Tokyo, Japan

[21] Appl. No.: 884,884

[22] Filed: Jul. 11, 1986

Related U.S. Application Data

[63] Continuation of Ser. No. 654,214, Sep. 25, 1984, abandoned.

[30] Foreign Application Priority Data

Sep. 26, 1983 [JP] Japan .................................. 58-176446

[51] Int. Cl.⁴ ............................................ B23K 11/16
[52] U.S. Cl. ..................................... 219/118; 219/91.2
[58] Field of Search ................. 219/91.2, 91.21, 91.22, 219/91.23, 92, 93, 117.1, 118

[56] References Cited

U.S. PATENT DOCUMENTS

3,155,809 11/1964 Griswold .............................. 219/86
3,909,581 9/1975 Stone et al. ........................ 219/120
4,313,996 2/1982 Newman et al. ..................... 428/215

FOREIGN PATENT DOCUMENTS

44-18176 8/1969 Japan .
106691 8/1980 Japan .................................. 219/118
187186 11/1982 Japan ................................. 219/91.2

OTHER PUBLICATIONS

U.S. patent application Ser. No. 559,239, filed Jun. 21, 1966.

Primary Examiner—E. A. Goldberg
Assistant Examiner—C. M. Sigda
Attorney, Agent, or Firm—Bacon & Thomas

[57] ABSTRACT

A method of resistance-welding two laminates each having a basic structure of a metal layer/a thermally softenable insulating layer/a metal layer, which allows welding with excellent welding strength and good outer appearance of a welded spot. In this method, two laminates are prepared in which each metal layer has a thickness of 0.02 to 0.5 mm, and a ratio of the total thickness of the metal layers of each laminate to the thickness of the laminate falls within a range between ⅛ and ⅝. Electrodes held at a temperature above the softening temperature of the insulating layers are urged against the laminates to soften the insulating layers and so bring the metal layers into contact with each other and to resistance-weld the laminates.

10 Claims, 6 Drawing Figures

METHOD OF WELDING LAMINATES EACH HAVING THE STRUCTURE OF METAL LAYER/THERMALLY SOFTENABLE INSULATING LAYER/METAL LAYER

This application is a continuation of application Ser. No. 654,214, filed Sept. 25, 1984, now abandoned.

BACKGROUND OF THE INVENTION

1. Field of the Invention

The present invention relates to a method of resistance-welding laminates each having a basic three-layered structure consisting of metal layer/thermally softenable insulating layer/metal layer

2. Description of the Prior Art

Laminated materials obtained by combining a metallic material with various nonmetallic materials to improve various properties of the metallic material have been proposed. Examples of such laminated materials include a laminated material in which a synthetic resin film is formed, or is coated, on the surface of a metallic material so as to prevent corrosion of the metal; a laminated material for vibration prevention in which a thin layer of a vibration absorbing material such as rubber is formed inside a metallic material so as to provide good vibration prevention; and a light-weight laminated material consisting of an inner layer of a synthetic resin and a thin outer layer of a metal so as to provide a light-weight material with flexural stiffness equivalent to a metallic material. U.S. Pat. No. 4,313,996 (Feb. 2, 1982) discloses an example of a light-weight laminated material having a structure of metal/synthetic resin/metal. A structure having the following dimensions is disclosed: each metal skin layer is from about 2 to 20 mils (0.05–0.5 mm) thick, the ratio of the core thickness to skin thickness is less than 9:1, and the total laminate thickness is from about 5 to about 65 mils (0.13–1.65 mm). However, this reference does not describe the welding method.

The laminated metallic materials described above are all combined with electrically insulating materials such as synthetic resins. Therefore, two such laminated metallic materials cannot be welded by a conventional welding method since the overall structure is not conductive and so cannot be welded together.

In view of this, various improved welding methods have been proposed and actually practiced. FIG. 1 shows a welding method for projection welding laminates each having a metal/insulating material/metal structure. In this method, one laminate 1 consists of an internal insulating layer 4 sandwiched between metal layers 3a and 3b. Another laminate 2 consists of an internal insulating layer 6 sandwiched between metal layers 5a and 5b. These laminates 1 and 2 are to be welded together. Projection welding is performed such that electrodes 7 and 8 are brought into contact with the opposing metal layers 3b and 5a, and holding jigs 20a and 20b hold the upper and lower metal layers 3a and 5b. However, in a laminated metallic material obtained in this manner, only the metal layers 3b and 5a are welded. Metal layers 3a and 5b are not welded. Therefore, the welding strength is very weak. If the metal layer is a thin layer, the welded portion cannot serve a practical purpose.

FIG. 2 shows a known welding method utilizing a bypass circuit. According to this method, each of two laminates 9 and 10 to be welded has the following structure. The laminate 9 has an internal insulating layer 12 sandwiched between metal layers 11a and 11b. The laminate 10 consists of an internal insulating layer 14 sandwiched between metal layers 13a and 13b. A bypass circuit 15 is formed between the metal layers 11a and 13b. In the welding start period, a current flows through an electrode 16, the metal layer 11a, the bypass circuit 15, the metal layer 13b, and an electrode 17. Then, Joule heat is generated in the metal layers 11a and 13b and melts the internal insulating layers 12 and 14. According to this method, the melted portion of the insulating layers 12 and 14 near the electrode is made to flow transversely by the urging force of the electrodes 16 and 17. At the same time, the metal layers 11a and 13b are deformed and urged against the metal layers 11b and 13a. As a result, a current flows directly between the electrodes 16 and 17 and the metal layers 11a, 11b, 13a and 13b to allow welding of the laminates. This method achieves excellent welding when applied to light-weight laminated materials in which the outer metal layers are thick and the internal insulating layers are thin. However, when this method is applied to a light-weight laminated material in which the outer metal layers are thin and the inner insulating layers are thick, problems are encountered. A light-weight laminated material of this type which can be welded by the method of the present invention is rendered light-weight by substituting the inner layer with a light material (normally insulating material) without decreasing the flexural stiffness. Such a light-weight laminated material is intended for use in a casing or the like. Therefore, deformation of the laminate at points other than the welding spot cannot be neglected.

Furthermore, in a light-weight laminate of this type, since the metal layer is thin, the outer metal layer is significantly damaged due to recessed deformation upon welding. Since the internal insulating layer generally consists of an organic material, it is decomposed and generates a gas at a melting point of the metal upon welding. This gas cannot diffuse out of the insulating layer due to the metal layers covering the insulating layer. The trapped gas then causes the problem of "doming". This tendency becomes particularly notable when the insulating layer is thick. However, when the method shown in FIG. 2 is adopted, the area in which the internal resin layer melts is not confined to the vicinity of the electrodes but also extends to the area connecting the electrodes and the bypass circuit. Therefore, the amount of resin which is squeezed by the urging forces of the electrodes is undesirably increased. In addition, a large amount of decomposition gas is produced. The laminate is distorted or waved within a wide area having the welded portion as its center. A good weld cannot, therefore, be obtained. In the method shown in FIG. 2, every time the welding spot is changed, the position of the bypass circuit must be changed and adjusted. This involves complex procedures. Furthermore, the shape of laminated materials which may be welded is limited due to the apparatus.

U.S. patent application Ser. No. 559,239 (June 21, 1966) discloses a method of welding conductors which are not coated with an insulator to a lead wire which is coated with an insulator. External heaters are connected to the electrodes to soften the insulators on the lead wire. Thus, the conductors and the lead wire are forcibly brought into contact with each other and are welded together. In this method, one part to be welded is the insulated wire, and the others are conductors which are not coated with an insulator. In such a welded article, the decomposition gas produced by heating the insulating material is freely discharged outside the article, so that a problem of "doming" is avoided.

U.S. Pat. No. 3,155,809 (Nov. 3, 1964) discloses a spot-welding or resistance-welding method. According to this method, when conductors coated with an insulator, particularly flexible ribbon-type cables, are electrically coupled, a pair of heated electrodes is used to clamp the conductors so as to soften the insulators. Then, the metal portions are physically brought into contact with each other. A welding current is made to flow between the electrodes to allow spot welding or resistance-welding. According to this method, as in the method disclosed in U.S. patent application Ser. No. 559,239, members to be welded are insulator coated conductors. With such members, the decomposition gas produced upon heating the insulators is freely discharged outside the structure, so that there is no doming problem.

SUMMARY OF THE INVENTION

It is an object of the present invention to provide a resistance-welding method, in which laminates each having a structure of metal/thermally softenable insulating material/metal are resistance-welded in such a manner that doming due to gas formation in the insulating material is prevented such that the reproducibility of the process and welding strength are improved and deformation of laminates at points other than the welded spots is prevented, thereby providing a welded structure having an excellent outer appearance.

In order to achieve the above object of the present invention, there is provided a resistance-welding method comprising the steps of:

preparing two laminates in which each metal layer has a thickness of 0.02 to 0.5 mm, and the total thickness of the metal layers is $\frac{1}{3}$ to $\frac{2}{3}$ of the total thickness of the laminate;

holding a pair of electrodes for resistance-welding an overlapped portion of the laminates at a temperature higher than a softening temperature of insulating layers, and urging said electrodes against surfaces at a welding spot of the laminates to soften the insulating layers, thereby contacting every adjacent metal layer; and supplying power to the pair of electrodes while all the adjacent metal layers are in contact with each other, thereby resitance-welding the laminates.

DETAILED DESCRIPTION OF THE PREFERRED EMBODIMENTS

Figure 1:
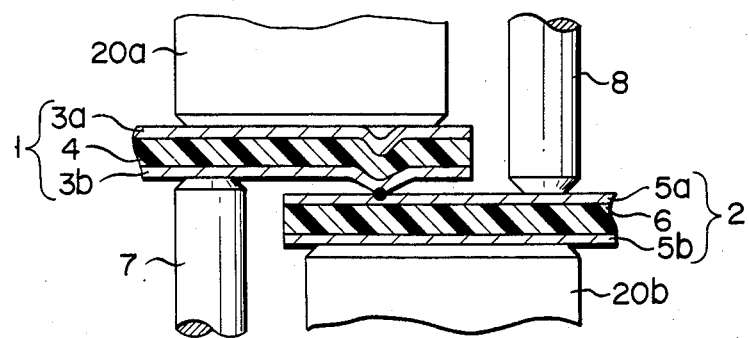
FIG. 1 is a schematic view showing a conventional method of resistance-welding laminates employing projection welding.

The resistance-welding method of the present invention is adapted to weld two laminates each having a basic structue of metal layer/thermally softenable insulating layer/metal layer. A laminate to be welded by the method of the present invention is intended for use in a casing or the like and is a light-weight substitute for a metal plate. In this laminate, the inner layer of a metal plate is replaced with a light-weight insulating layer, so that the overall laminate can be rendered light without degrading its flexural stiffness.

Each metal layer of such a laminate may consist of a metal such as iron, lead, zinc, or aluminum; an alloy thereof with other elements such as carbon, chromium, or titanium; or such metals or alloys with various conductive surface-treated layers formed by metal plating or chemical treatment. Each metal layer is selected to have a thickness of 0.02 to 0.5 mm. The ratio of the total thickness of the two metal layers of each laminate is $\frac{1}{3}$ to $\frac{2}{3}$ of the total thickness of the laminate. In order not to degrade the flexural stiffness, each metal layer must have a certain thickness. However, to provide a light laminate, each metal layer should be as thin as possible. If each metal layer is thin, the insulating layer must be thick to keep thickness of the laminate uncharged. The thicker the insulating layer, the more gas it generates upon welding. In this case, the thin metal layer may not be able to withstand the pressure of the gas and deforms. Therefore, the welded spot may have an unsatisfactory strength and a poor outer appearance and be easily deformed. In view of this, each metal layer must have a thickness above a predetermined thickness. However, if a metal layer is too thick, when the insulating layer is heated through the metal layers, the heat is dissipated by the metal layers to a great extent, resulting in a long welding time. Therefore, each metal layer must have a thickness less than a predetermined value.

The absolute and relative thickness of each metal layer must thus be defined to fall within predetermined ranges in order to maintain the properties of the laminates, to perform satisfactory welding, and to improve the strength and outer appearance of the welded spot. The specific ranges were determined by the present inventors in experiments under different conditions and will be described with reference to Example 4. Although U.S. Pat. No. 4,313,996 specifies the dimensions of the metal layers and insulating (synthetic resin) layers having the same structure as that of the present invention, they were not determined for the purpose of performing satisfactory resistance-welding and providing satisfactory strength and outer appearance at the welded spot.

The material of the thermally softenable insulating layer contained in each laminate can be a thermoplastic resin such as a polyolefin, polyvinyl chloride, polyvinylidene chloride, polyester, polyamide, polycarbonate, polyvinyl acetate, polyacetal, polystyrene, ABS resin, methyl polymethacrylate, or a fluorine-containing resin. Of these materials, preferred examples in view of formability and weldability may include polyolefins such as homopolymers or copolymers of an α-olefin, e.g., ethylene, propylene, 1-butene, 1-pentene, 3-methyl-1-butene, 1-hexene, 4-methyl-1-pentene, 1-heptene, or 1-octene; copolymers of these α-olefins with small amounts of monomers, e.g., vinyl acetate, acrylic acid, methacrylic acid, methyl acrylate, or methyl methacrylate; or graft-modified polyolefins obtained by grafting the above polyolefins with monomers such as vinyl acetate, acrylic acid, methacrylic acid, maleic acid, fumaric acid, methyl acrylate, ethyl acrylate, ethyl maleate, or maleic anhydride. The material of the thermally softenable insulating layer may be a rubbery material such as natural rubber, a butadiene-styrene copolymer, nitrile rubber, chloroprene rubber, polyisoprene, butyl rubber, or polyisobutylene. Instead of these materials, the thermally softenable insulating layer may consist of other insulators which can be softened and made to flow upon being heated.

The insulating layer and the metal layer can be laminated by conventional methods. For example, the insulating layer can be melted and adhered to the metal layer. Alternatively, the insulating layer and the metal layer can be adhered together with an adhesive.

The method of resistance-welding two laminates each having the above-mentioned structure will be described with reference to the embodiment shown in FIG. 3.

One laminate 21 has an internal thermally softenable insulating layer 22 and metal layers 23a and 23b sandwiching it. Another laminate 24 has an internal thermally softenable insulating layer 25 and metal layers 26a and 26b sandwiching it. The overlapping portion of these laminates 21 and 24 forms a welding spot. Electrodes 27 and 28 are arranged at the two surfaces of the welding spot. Heaters 29 and 30 are arranged around the electrodes 27 and 28, respectively. The heaters 29 and 30 heat the electrodes 27 and 28 and keep them at a temperature higher than the softening temperature of the insulating layers 22 and 25. When the insulating layers consist of polypropylene, the electrodes 27 and 28 are kept at a temperature higher than the softening temperature of polypropylene, i.e., 165° C. The heated electrodes 27 and 28 are brought into contact with the laminates 21 and 24. Then, inside the respective laminates, heat from the electrodes 27 and 28 is conducted from the metal layers 23a and 26b to the insulating layers 22 and 25, and the insulating layers 22 and 25 are sequentially fluidized. The fluidized portions of the insulating layers mainly overlap the portions immediately below the metal layers since the electrodes are in point contact or in surface contact close to point contact with the metal layers. As a result, the electrodes urged against the laminates squeeze the fluidized portions of the insulating layers and come closer to each other. The insulating layers are further squeezed out at the fluidized portions, and the metal layers 23a and 25b are deformed, so that the metal layers 23a, 23b, 26a and 26b are brought into contact with each other. The squeezed portions of the insulating layers bulge around the welding spot and are cooled and solidified.

Another method for softening and fluidizing the insulating layers may be adopted wherein heated punches or the like are pressed toward a prospective welding spot of laminates to fluidize the insulating layers, the fluidized insulating layers are squeezed by the pressure of the punches, and electrodes are then brought into contact with the welding spot. However, this method is not suitable for welding laminates according to the present invention for the following reason. When the heated punches are removed and the electrodes are brought into contact with the metal layers, the deformed metal layers spring back and are separated from each other so the insulator flows into the space formed between the separated metal layers. Then, power cannot be supplied to the metal layers. Furthermore, due to the two-step stress exerted by the heated punches and electrodes, a thin matal layer may be torn away.

Figure 4:
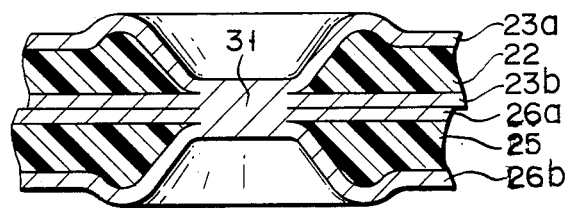
FIG. 4 is a sectional view of laminates welded by the method shown in FIG. 3.

According to the method of the present invention, before or when the metal layers 23a, 23b, 26a and 26b are brought into direct contact with each other, a current is supplied to the electrodes 27 and 28 to resistance-weld the laminates 21 and 24. As a result, as shown in FIG. 4, a uniformly bulged insulating layer is formed to surround a directly welded spot 31. The welded spot has a high welding strength and a good outer appearance. The inventors think that this is attributed to the following reason. According to the present invention, since both the electrodes 27 and 28 are heated, the insulating layers are softened within a short time to prevent the generation of a decomposition gas from the insulating layers. Generation of the decomposition gas is further prevented by using laminates 21 and 24 having insulating layers of a small thickness. Therefore, since welding can be performed without adverse influence from a decomposition gas, reproducibility of the welding process and the welding strength are improved, doming is prevented, and a good outer appearance is obtained.

Electrodes 27 and 28 may be made of a material ordinarily used in resistance welding and, preferably, one of the materials described hereinafter.

The material is generally one having an electric resistance lower than that of the material to be welded. When the material to be welded is, for example, iron, an alloy such as a copper-based chromium alloy is used so as to suppress heat generation due to contact resistance between the electrodes and the material to be welded and to prevent fusing. However, since laminates of the present invention have insulating layers between metal layers, the contact resistance between the metal layers upon welding is unstable. Even if the tip shape of the electrode is slightly changed, the contact resistance is significantly influenced and the welded area becomes unstable. For this reason, with conventional copper-based chromium alloy electrodes, dressing of electrode tips is performed after welding 30 spots to assure satisfactory welding performance. According to the present invention, although electrodes of this alloy can be used, if metal layers consist of iron or an iron alloy, at least the tips of the electrodes can be made of molybdenum having a resistance equivalent to that of iron. When electrodes of such materials are used, the electrodes generate heat upon being powered so as to facilitate melting of insulators utilizing the contact resistance at the interface between the metal layers. For this reason, the above described problem can be eliminated, and the dressing interval of electrodes can be extended to welding 300 or more spots.

When molybdenum electrodes are used to resistance-weld iron members, the electrodes and iron fuse and the iron members cannot be welded. However, with laminates having a structure of iron layer/insulating layer/iron layer, the contact resistance at the interface is high. Thus, the contact resistance between iron and molybdenum is considered to be suppressed, and consequently, fusing of the electrodes is prevented.

When molybdenum electrodes are used, series-welding can be performed. When series-welding of laminates according to the present invention is performed, using electrodes made of copper-based chromium alloy, the contact resistance inside the laminates is inevitably unstable. Consequently, the welding strength is too great at one spot while it is too small at another spot, thus preventing welding. However, with molybdenum electrodes heating by the contact resistance can be negated by the heat generated by the electrodes, and uneven welding strength can be avoided. Series-welding is thus facilitated.

Figure 5:
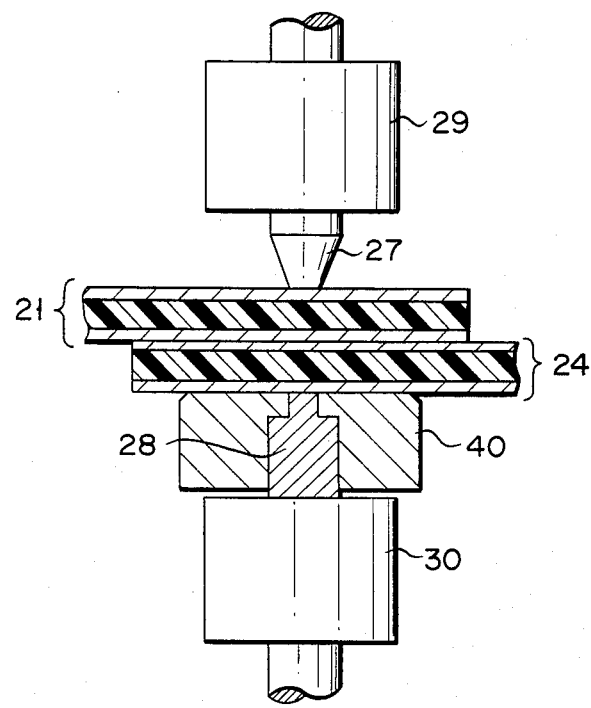
FIG. 5 is a schematic view showing a method of resistance-welding laminates according to another embodiment of the present invention.
Figure 6:
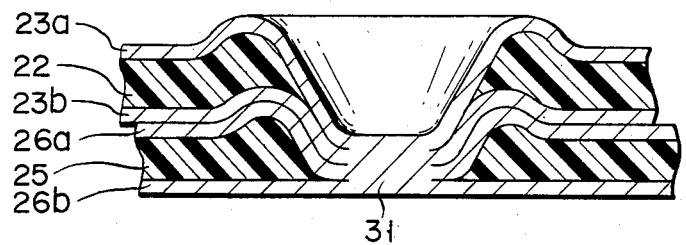
FIG. 6 is a sectional view showing laminates welded by the method shown in FIG. 5.

FIG. 5 shows another embodiment of a welding method according to the present invention. An object of this emodiment is to eliminate deformation of one surface of the welded spot so as to provide a smooth welded spot when viewed from one side. In order to achieve this object, a holding jig 40 is provided around an electrode 28 on the same side of a welding spot on which a smooth surface is to be formed. The holding jig 40 must be arranged parallel to the tip of the electrode 28, have a smooth surface in contact with a laminate 24 and have an area wider than the thermally deformed area of the welded portion. The material of the electrode 28 at the side of the holding jig 40 preferably has a greater hardness than that of the electrode 27 at the other side in order to prolong the electrode life. As in the case of the electrode 28, the holding jig 40 is heated to and kept at a temperature higher than the softening temperature of insulating layers so as to improve the welding speed and the appearance of the welded spots. When welding is performed using the holding jig 40, even if the insulating layers are heated and softened, the metal layer 26b in contact with the holding jig 40 is not deformed and is kept smooth, as shown in FIG. 6. Therefore, the welded spot of the finished, welded laminates have one smooth side and a very good outer appearance. In order to provide the same effect, a back bar electrode can be used in place of the holding jig.

The embodiments shown in FIGS. 3 to 6 are described with reference to spot-welding. However, the present invention can also be applied to seam-welding or projection-welding.

The present invention will now be described by way of its Examples.

EXAMPLE 1

Figure 3:
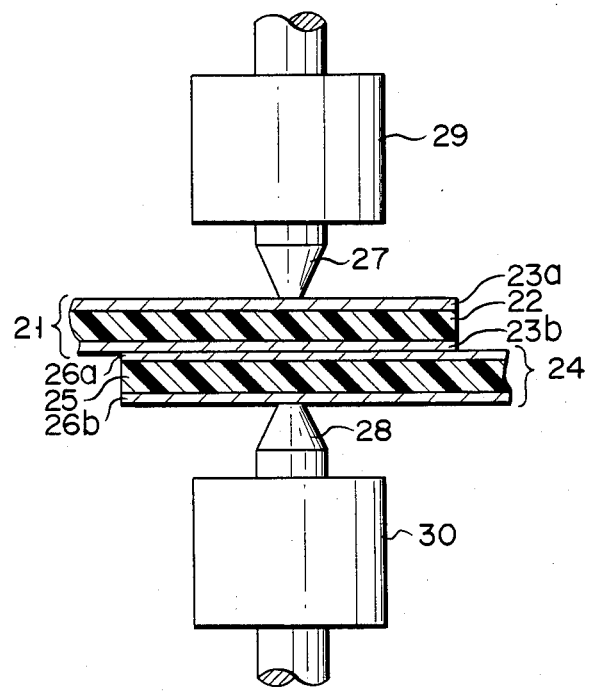
FIG. 3 is a schematic view showing a method of resistance-welding laminates according to an embodiment of the present invention.

Resistance-welding of laminates was performed by the method shown in FIGS. 3 and 5. The welding results together with the materials, dimensions and welding conditions are shown in Table 1. Two metal plates and insulating layers of laminates were adhered with a modified polyolefin adhesive layer having an adhesive functional group.

TABLE 1

| No. | Method | Laminate First metal layer Material | Laminate First metal layer Thickness (mm) | Laminate Second metal layer Material | Laminate Second metal layer Thickness (mm) | Laminate Insulating layer Material | Laminate Insulating layer Thickness (mm) | Welding condition Upper electrode Temperature (°C.) | Welding condition Upper electrode Material | Welding condition Lower electrode Temperature (°C.) | Welding condition Lower electrode Material | Thermally deformed area (diameter in mm) | Con-* tact area (diameter in mm) | Welding result | Evaluation |
|---|---|---|---|---|---|---|---|---|---|---|---|---|---|---|---|
| 1 | FIG. 3 | iron foil | 0.2 | iron foil | 0.2 | polypropylene | 0.42 | 280 | Cu—Cr | 280 | Cu—Cr | 10 | 4 | uniform projection | o |
| 2 | FIG. 5 | iron foil | 0.2 | iron foil | 0.2 | polypropylene | 0.42 | 300 | Cu—Cr | 240 | Cu—Cr | 12 | 35 | one smooth side | o | o ... Very good outer appearance (Primary welding voltage: 160 V; power cycle number: 5 c/s; electrode pressure: 400 kg)
*The contact area between the holding jig and the laminates

EXAMPLE 2

Various welding conditions were set wherein the heating temperature of the electrodes and the softening temperature of the insulating layers were varied, and laminates were welded by the method shown in FIG. 3.

The obtained results are shown in Table 2 together with the structure of the laminates and the welding conditions. A welder used in Example 2 was an AC spot welder 3111-3, available from Durex Co., Ltd., West Germany, connected to a power source control apparatus A-11, available from the same company. In order to allow a variable voltage to be applied to the primary side of the welding transformer, variable-voltage transformers of 200 V and 20 A were added. Upper and lower welding electrodes (of 12 mm diameter) of the welder had truncated conical shapes having a top diameter of 4 mm and a cone angle of 60°. Ring heaters of 600 W capacity having temperature controllers were mounted on these electrodes.

TABLE 2

| No. | Method | Laminate First metal layer Material | Laminate First metal layer Thickness (mm) | Laminate Second metal layer Material | Laminate Second metal layer Thickness (mm) | Laminate Insulating layer Material | Laminate Insulating layer Thickness (mm) | Welding condition Upper electrode Temperature (°C.) | Welding condition Upper electrode Material |
|---|---|---|---|---|---|---|---|---|---|
| 3 | FIG. 3 | steel* plate | 0.2 | steel* plate | 0.2 | polypropylene | 0.42 | 25 | Cu—Cr |
| 4 | FIG. 3 | steel* plate | 0.2 | steel* plate | 0.2 | polypropylene | 0.42 | 220 | Cu—Cr |
| 5 | FIG. 3 | steel* plate | 0.2 | steel* plate | 0.2 | polypropylene | 0.42 | 240 | Cu—Cr |
| 6 | FIG. 3 | steel* plate | 0.2 | steel* plate | 0.2 | polypropylene | 0.42 | 260 | Cu—Cr |

TABLE 2-continued

| No. | Method | First metal layer Material | Thickness (mm) | Second metal layer Material | Thickness (mm) | Insulating layer Material | Thickness (mm) | Upper electrode Temperature (°C.) | Material |
|---|---|---|---|---|---|---|---|---|---|
| 7 | FIG. 3 | steel* plate | 0.2 | steel* plate | 0.2 | polypropylene | 0.42 | 280 | Cu—Cr |
| 8 | FIG. 3 | steel* plate | 0.2 | steel* plate | 0.2 | polypropylene | 0.42 | 300 | Cu—Cr |
| 9 | FIG. 3 | steel* plate | 0.2 | steel* plate | 0.2 | polypropylene | 0.42 | 300 | Cu—Cr |
| 10 | FIG. 3 | steel* plate | 0.2 | steel* plate | 0.2 | polypropylene | 0.42 | 300 | Cu—Cr |
| 11 | FIG. 3 | steel* plate | 0.2 | steel* plate | 0.2 | polypropylene | 0.42 | 300 | Cu—Cr |
| 12 | FIG. 3 | steel* plate | 0.2 | steel* plate | 0.2 | polypropylene | 0.42 | 300 | Cu—Cr |
| 13 | FIG. 3 | steel* plate | 0.2 | steel* plate | 0.2 | polypropylene | 0.42 | 300 | Cu—Cr |

| | | Welding condition | | | | Welding result | | | |
|---|---|---|---|---|---|---|---|---|---|
| | | Lower electrode | | Thermally deformed area | Contact area | Time before current | Welding pressure | | |
| No. | Method | Temperature (°C.) | Material | (diameter in mm) | (diameter in mm) | flow (second) | (kg/spot) | Evaluation | Remarks |
| 3 | FIG. 3 | 25 | Cu—Cr | — | 4 | 60 or more | — | x | No current flow |
| 4 | FIG. 3 | 220 | Cu—Cr | — | 4 | 60 or more | — | x | 1 minute or more before |
| 5 | FIG. 3 | 240 | Cu—Cr | 12 | 4 | 20 | 80 | Δ | Doming around weld spot |
| 6 | FIG. 3 | 260 | Cu—Cr | 10 | 4 | 6 | 112 | o | Excellent |
| 7 | FIG. 3 | 280 | Cu—Cr | 10 | 4 | 1> | 122 | o | Excellent |
| 8 | FIG. 3 | 300 | Cu—Cr | 10 | 4 | 1> | 140 | o | Excellent |
| 9 | FIG. 3 | 240 | Cu—Cr | 10 | 4 | 1 | — | Δ | Doming around lower welded spot side |
| 10 | FIG. 3 | 200 | Cu—Cr | 10 | 4 | 3 | — | Δ | Doming around lower welded spot side |
| 11 | FIG. 3 | 150 | Cu—Cr | 10 | 4 | 3 | — | Δ | Doning around lower welded spot side |
| 12 | FIG. 3 | 100 | Cu—Cr | — | 4 | 60 or | — | x | 1 minute or more before current flow |
| 13 | FIG. 3 | 25 | Cu—Cr | — | 4 | 60 or more | — | x | 1 minute or more before current flow |

*Electrolytically chromium-treated plate of soft cold rolled steel (Tin free steel)
o . . . Very good outer appearance
Δ . . . Doming caused by gasification of the contained resin upon welding
x . . . Not practically usable (Primary welding voltage: 160 V; power cycle number: 5 c/s; electrode pressure: 400 kg)

Figure 2:
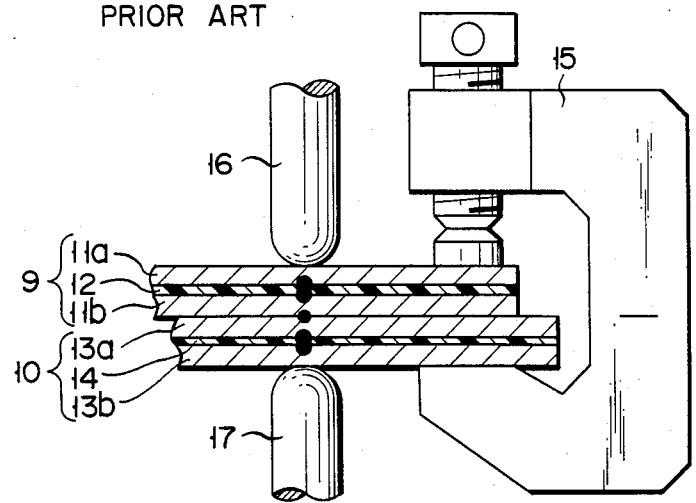
FIG. 2 is a schematic view showing a conventional method of resistance-welding laminates utilizing a bypass circuit.

In Example 2, when the upper and lower electrodes were not heated (sample No. 3), a welding current did not flow. For this reason, a short-circuit, as shown in FIG. 2, was added. However, thermal deformation at the welded point was significant and thermal deformation also occurred in an area between the welded point and the short-circuit of the current. Thus, the only welded laminates obtained were those not suitable for practical use. For sample Nos. 4, 12 and 13 (temperature: 220° C. or 300° C.), the time before current flow after application of pressure on the electrodes was 1 minute or more. This is not practical from the viewpoint of work speed. For sample Nos. 5 and 9 to 11 (temperature: 240° C.), heating of the inner resin layer at the welding point and squeezing of the melted resin were insufficient. Due to the high temperature applied during welding, the insulating layer at the welding point is gasified to urge upward the metal layer around the welded point, thereby causing doming, which is not desirable from the viewpoints of outer appearance and welding strength. For sample Nos. 6 to 8 (temperature of 260° C. or higher), an excellent welding operation could be performed. However, if the electrode temperature is too high, wear of the electrode tips is significant. Therefore, the electrode temperature preferably falls within the range of 260° to 300° C.

EXAMPLE 3

Laminates and welder as used in Example 2 were used for welding by the method shown in FIG. 5. Welding was performed by restricting the contact area between the holding jig and the laminates to portions directly above and below the thermally deformed area. The obtained results are shown in Table 3 below, together with the structure of the laminates and the welding conditions.

TABLE 3

| | | Laminate | | | | | | Welding condition | |
|---|---|---|---|---|---|---|---|---|---|
| | | First metal layer | | Second metal layer | | Insulating layer | | Upper electrode | |
| No. | Method | Material | Thickness (mm) | Material | Thickness (mm) | Material | Thickness (mm) | Temperature (°C.) | Material |
| 14 | FIG. 5 | steel* plate | 0.2 | steel* plate | 0.2 | polypropylene | 0.42 | 300 | Cu—Cr |

TABLE 3-continued

| No. | Method | Material | Thickness (mm) | Material | Thickness (mm) | Material | Thickness (mm) | Temperature (°C) | Material |
|---|---|---|---|---|---|---|---|---|---|
| 15 | FIG. 5 | steel* plate | 0.2 | steel* plate | 0.2 | polypropylene | 0.42 | 300 | Cu—Cr |
| 16 | FIG. 5 | steel* plate | 0.2 | steel* plate | 0.2 | polypropylene | 0.42 | 300 | Cu—Cr |
| 17 | FIG. 5 | steel* plate | 0.2 | steel* plate | 0.2 | polypropylene | 0.42 | 300 | Cu—Cr |
| 18 | FIG. 5 | steel* plate | 0.2 | steel* plate | 0.2 | polypropylene | 0.42 | 300 | Cu—Cr |
| 19 | FIG. 5 | steel* plate | 0.2 | steel* plate | 0.2 | polypropylene | 0.42 | 300 | Cu—Cr |
| 20 | FIG. 5 | steel* plate | 0.2 | steel* plate | 0.2 | polypropylene | 0.42 | 300 | Cu—Cr |
| 21 | FIG. 5 | steel* plate | 0.2 | steel* plate | 0.2 | polypropylene | 0.42 | 300 | Cu—Cr |
| 22 | FIG. 5 | steel* plate | 0.2 | steel* plate | 0.2 | polypropylene | 0.42 | 300 | Cu—Cr |
| 23 | FIG. 5 | steel* plate | 0.2 | steel* plate | 0.2 | polypropylene | 0.42 | 300 | Cu—Cr |
| 24 | FIG. 5 | steel* plate | 0.2 | steel* plate | 0.2 | polypropylene | 0.42 | 300 | Cu—Cr |

| | | Lower electrode | | Welding condition | | Welding result | | | |
|---|---|---|---|---|---|---|---|---|---|
| No. | Method | Temperature (°C) | Material | Thermally deformed area (diameter in mm) | Contact area (diameter in mm) | Time before current flow (second) | Welding pressure (kg/spot) | Evaluation | Remarks |
| 14 | FIG. 5 | 300 | Cu—Cr | 14 | 12 | 1> | 140 | o | Rough lower surface |
| 15 | FIG. 5 | 240 | Cu—Cr | 14 | 12 | 1> | 138 | o | Rough lower surface |
| 16 | FIG. 5 | 200 | Cu—Cr | 14 | 12 | 3 | — | Δ | Rough lower surface |
| 17 | FIG. 5 | 150 | Cu—Cr | 14 | 12 | 6 | — | Δ | Rough lower surface |
| 18 | FIG. 5 | 100 | Cu—Cr | — | 12 | 60 or more | — | x | |
| 19 | FIG. 5 | 25 | Cu—Cr | — | 12 | 60 or more | — | x | |
| 20 | FIG. 5 | 300 | Cu—Cr | 14 | 35 | 1> | 140 | o | Smooth lower surface |
| 21 | FIG. 5 | 260 | Cu—Cr | 14 | 35 | 1> | 140 | o | Smooth lower surface |
| 22 | FIG. 5 | 240 | Cu—Cr | 14 | 35 | 1> | 132 | o | Smooth lower surface |
| 23 | FIG. 5 | 220 | Cu—Cr | 14 | 35 | 1> | 130 | Δ | Smooth lower surface |
| 24 | FIG. 5 | 150 | Cu—Cr | 14 | 35 | 3 | — | Δ | Smooth lower surface |

*Electrolytically chromium-treated plate of soft cold rolled steel (Tin free steel)
o ... Very good outer appearance
Δ ... Doming caused by gasification of the contained resin upon welding
x ... Not practically usable (Primary welding voltage: 160 V; power cycle number: 5 c/s; electrode pressure: 400 kg)

In Example 3, the welding performance was influenced by the temperature of the upper and lower electrodes, as in the case of Example 2. Among laminates in which the contact area with the holding jig is smaller than the thermally deformed area, those which resulted in satisfactory welding (sample Nos. 14 to 17) caused ring-like thermal deformation in the lower surface of the welded point and could not provide one smooth side. Those which had a contact area with the holding jig larger than the thermally deformed area had a wider suitable electrode temperature range (for the lower electrode) of 240° to 300° C., shifted toward lower temperatures than those in Example 2. Substantially no thermal deformation was observed around the lower surface of the welded spot welded within this temperature range, and one smooth side was provided.

EXAMPLE 4

Welding was performed following the same procedures as those in Example 1 for laminates in which the thickness of each metal layer of each laminate and the ratio of the total thickness of the two metal layers of each laminate to the thickness of the laminate fell inside and outside the ranges defined according to the present invention. The obtained results are shown in Table 4 together with the structure of the laminates and the welding conditions.

TABLE 4

| | | Laminate | | | | | | Welding condition | |
|---|---|---|---|---|---|---|---|---|---|
| | | First metal layer | | Second metal layer | | Insulating layer | | Upper electrode | |
| No. | Method | Material | Thickness (mm) | Material | Thickness (mm) | Material | Thickness (mm) | Temperature (°C) | Material |
| 25 | FIG. 3 | iron foil | 0.2 | iron foil | 0.2 | polypropylene | 0.42 | 280 | Cu—Cr |
| 26 | FIG. 3 | iron | 0.2 | iron | 0.2 | polypropylene | 1.0 | 280 | Cu—Cr |

TABLE 4-continued

| | | | | | | | | | |
|---|---|---|---|---|---|---|---|---|---|
| 27 | FIG. 3 | foil iron foil | 0.8 | foil iron foil | 0.8 | polypropylene | 1.6 | 280 | Cu—Cr |

| | | Welding condition | | | | Welding results | | | |
|---|---|---|---|---|---|---|---|---|---|
| | | Lower electrode | | Thermally deformed area (diameter) | Contact area (diameter in mm) | Time before current flow (second) | Welding pressure (kg/spot) | Evaluation | Remarks |
| No. | Method | Temperature (°C.) | Material | | | | | | |
| 25 | FIG. 3 | 280 | Cu—Cr | 10 | 4 | 1> | 122 | o | |
| 26 | FIG. 3 | 280 | Cu—Cr | 10 | 4 | 6 | — | x | Surface metal layer broke down |
| 27 | FIG. 3 | 280 | Cu—Cr | 10 | 4 | 60 or more | — | x | 1 minute or more before current flow | o ... Very good outer appearance
Δ ... Doming caused by gasification of the contained resin upon welding
x ... Not practically usable In Example 4, with a sample (No. 25) in which the thickness of the metal layer and the ratio of the total thickness of the metal layers to the thickness of the laminate fell within the ranges defined by the present invention, an excellent welding performance was obtained. However, with a sample (No. 26) having thicker insulating layers because of a smaller ratio of total thickness of the metal layers compared to the thickness of the laminate, and with a sample (No. 27) having thicker metal layers, no satisfactory results were obtained.

What is claimed is:

1. A method of resistance-welding two laminates each having a basic structure of a metal layer/a thermally softenable insulating layer/a metal layer, comprising the steps of:

preparing laminates in which the thickness of each metal layer falls within a range between 0.02 and 0.5 mm and the ratio of the total thickness of the two metal layers of each laminate to the total thickness of the laminate falls within a range between ⅓ and ⅔;

holding a pair of electrodes for resistance-welding on opposite sides of overlapped portions of the two laminates, heating the overlapped portions to a temperature not lower than the softening temperature of the insulating layers by electrodes which are heated by heaters arranged around the electrodes to a temperature higher than the softening temperature of the insulating layers, thus softening the insulating layers, and applying pressure to the pair of electrodes at the overlapped portions to thereby bring the metal layers of the two laminates into contact with each other; and supplying power to said pair of electrodes while said metal layers of the two laminates are in contact with each other.

2. A method according to claim 1, wherein heaters for heating the electrodes are arranged around the electrodes.

3. A method according to claim 1, wherein a holding jig in contact with the laminates surrounds one of said electrodes, the surface of said holding jig is parallel to the tip of said electrode, contact areas of said holding jig with the laminates being wider than a thermally deformed area of the welded spot of the laminates.

4. A method according to claim 1, wherein the thermally softenable insulating layers consist of a thermoplastic resin.

5. A method according to claim 4, wherein the thermoplastic resin is a polyolefin.

6. A method according to claim 1, wherein the metal layers consist of a material selected from the group consisting of a metal, an alloy and a metal member and an alloy member surface-treated with a conductive material.

7. A method according to claim 1, wherein the resistance welding is spot welding.

8. A method according to claim 1, wherein the metal layers of the laminates consist of a material selected from the group consisting of iron and iron-based alloys, each of said electrodes having at least tips thereof consisting of molybdenum.

9. A method according to claim 1, wherein when the insulating layers consist of a polypropylene, the electrodes are heated to a temperature falling within a range between 260° and 300° C.

10. A method according to claim 3, wherein when the insulating layers consist of a polypropylene, the electrodes having the holding jig therearound are heated to a temperature falling within a range between 240° and 300° C.

* * * * *